(12) United States Patent
Shin et al.

(10) Patent No.: US 11,587,622 B2
(45) Date of Patent: Feb. 21, 2023

(54) NON-VOLATILE MEMORY DEVICE INCLUDING HIGH VOLTAGE SWITCHING CIRCUIT, AND OPERATION METHOD OF THE NON-VOLATILE MEMORY DEVICE

(71) Applicant: Samsung Electronics Co., Ltd., Suwon-si (KR)

(72) Inventors: Hyunjin Shin, Yongin-si (KR); Dohui Kim, Anyang-si (KR); Sanggyeong Won, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/326,397

(22) Filed: May 21, 2021

(65) Prior Publication Data
US 2021/0391015 A1  Dec. 16, 2021

(30) Foreign Application Priority Data
Jun. 15, 2020  (KR) .......................... 10-2020-0072463

(51) Int. Cl.
*G11C 16/30* (2006.01)
*G11C 16/10* (2006.01)
*G11C 16/14* (2006.01)
*G11C 7/10* (2006.01)
*G11C 16/26* (2006.01)

(52) U.S. Cl.
CPC .......... *G11C 16/102* (2013.01); *G11C 7/1063* (2013.01); *G11C 16/14* (2013.01); *G11C 16/26* (2013.01); *G11C 16/30* (2013.01)

(58) Field of Classification Search
CPC ..... G11C 16/102; G11C 7/1063; G11C 16/14; G11C 16/26; G11C 16/30; G11C 16/32; G11C 16/08; G11C 16/12; G06F 3/0614
See application file for complete search history.

(56) References Cited

U.S. PATENT DOCUMENTS

| 5,483,496 | A | 1/1996 | Murakawa |
| 6,031,774 | A | 2/2000 | Chung |
| 6,456,534 | B2 | 9/2002 | Jinbo |
| 7,545,676 | B2 | 6/2009 | Kang |
| 7,643,351 | B2 | 1/2010 | Park et al. |
| 7,881,122 | B2 | 2/2011 | Ariki |
| 9,143,118 | B2 | 9/2015 | Ito |

(Continued)

FOREIGN PATENT DOCUMENTS

KR   1019960016497   12/1996
KR   100481841 B1   8/2005

*Primary Examiner* — Jay W. Radke
(74) *Attorney, Agent, or Firm* — Myers Bigel, P.A.

(57) ABSTRACT

A memory device includes a memory cell array, a voltage switching circuit configured to switch a plurality of voltages provided to the memory cell array in response to a switching control signal, a discharge circuit configured to discharge the voltage switching circuit in response to a discharge signal, and a control circuit configured to generate the switching control signal based on a command and a high voltage enable signal received from outside of the memory device. The voltage switching circuit includes a high voltage switching circuit, and a low voltage switching circuit. The control circuit is configured to generate the discharge signal based on the command and an activated high voltage enable signal responsive to detecting external abortion while performing an operation corresponding to the command from among a program operation and an erase operation.

20 Claims, 14 Drawing Sheets

(56) References Cited

U.S. PATENT DOCUMENTS

| | | |
|---|---|---|
| 9,349,462 B1 | 5/2016 | Shirota |
| 2015/0348641 A1 | 12/2015 | Ito |
| 2016/0065000 A1 | 3/2016 | Maeda |
| 2017/0062056 A1 | 3/2017 | Park et al. |

NON-VOLATILE MEMORY DEVICE INCLUDING HIGH VOLTAGE SWITCHING CIRCUIT, AND OPERATION METHOD OF THE NON-VOLATILE MEMORY DEVICE

CROSS-REFERENCE TO RELATED APPLICATION

This application is based on and claims priority to 35 U.S.C. § 119 to Korean Patent Application No. 10-2020-0072463, filed on Jun. 15, 2020, in the Korean Intellectual Property Office, the disclosure of which is incorporated by reference herein in its entirety.

BACKGROUND

The inventive concept relates to memory devices and operation methods thereof, and, more particularly, to a memory device including a high voltage switching circuit and an operation method of the memory device.

In recent years, the demand for highly integrated and urge capacity non-volatile semiconductor memory devices has been increasing. Flash memory, which is mainly used in current portable electronic apparatuses, is a representative example of a non-volatile memory. A program operation or an erase operation of this non-volatile memory device may require a relatively high voltage, and a read operation thereof may require a relatively low voltage. Non-volatile memory devices may include a high voltage switching circuit for switching a high voltage provided to a memory cell array, and a low voltage switching circuit for switching a low voltage provided to the memory cell array.

SUMMARY

Some embodiments of the inventive concept may provide protection of transistors included in a low voltage switching circuit by discharging a high voltage switching circuit.

According to an aspect of the inventive concept, there is provided a memory device including a memory cell array, a voltage switching circuit configured to switch a plurality of voltages provided to the memory cell array in response to a switching control signal, a discharge circuit configured to discharge the voltage switching circuit in response to a discharge signal, and a control circuit configured to generate the switching control signal based on a command and a high voltage enable signal received from outside of the memory device. The voltage switching circuit includes a high voltage switching circuit configured to switch a high voltage, and a low voltage switching circuit configured to switch a low voltage having a lesser magnitude than a magnitude of the high voltage. The control circuit is configured to generate the discharge signal based on the command and an activated high voltage enable signal responsive to detecting external abortion while performing an operation corresponding to the command from among a program operation and an erase operation.

According to another aspect of the inventive concept, there is provided a memory device including a memory cell array, a voltage switching circuit configured to switch a plurality of voltages provided to the memory cell array in response to a switching control signal, and a control circuit configured to generate the switching control signal based on a command and a high voltage enable signal received from outside of the memory device. The voltage switching circuit includes a high voltage switching circuit configured to switch a high voltage, a low voltage switching circuit configured to switch a low voltage having a lower magnitude than a magnitude of the high voltage, and a discharge circuit configured to discharge the high voltage switching circuit in response to an abort flag. The control circuit is configured to generate the abort flag based on the command and an activated high voltage enable signal responsive to detecting external abortion while performing an operation corresponding to the command from among a program operation and an erase operation.

According to another aspect of the inventive concept, there is provided an operation method of a memory device including a memory cell array and a voltage switching circuit configured to switch a plurality of voltages provided to the memory cell array, the operation method including receiving a command from among a program command and an erase command, receiving an activated high voltage enable signal, outputting a busy signal at a first level to outside of the memory device while performing an operation corresponding to the command, receiving an abortion signal from external to the memory device during the operation corresponding to the command, and discharging a high voltage switching circuit of the voltage switching circuit responsive to the abortion signal. The voltage switching circuit includes the high voltage switching circuit configured to switch a high voltage, and a low voltage switching circuit configured to switch a low voltage having a lower magnitude than a magnitude of the high voltage.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Figure 1:
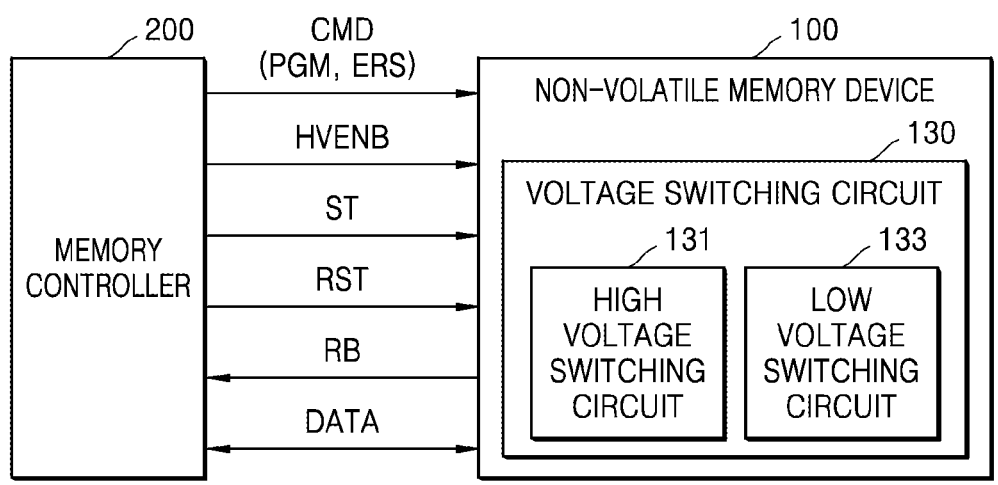
FIG. 1 is a block diagram of a memory system according to an embodiment of the inventive concept.

Hereinafter, the inventive concept will be described more fully with reference to the accompanying drawings, in which example embodiments of the inventive concept are shown. The same reference numerals are used for the same elements in the drawings, and redundant descriptions thereof will be omitted. As used herein, the term "and/or" includes any and all combinations of one or more of the associated listed items. It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

FIG. 1 is a block diagram of a memory system 10 according to an embodiment of the inventive concept.

Referring to FIG. 1, the memory system 10 may include a memory device 100 and a memory controller 200. The memory device 100 may be a non-volatile memory device. According to an embodiment, the memory device 100 may be an embedded flash memory device.

In response to a write/read request from a host, the memory controller 200 may control the memory device 100, such that data is read from the memory device 100 or written to the memory device 100. The memory controller 200 may control program, read and erase operations with respect to the memory device 100 by providing a command CMD, an address, and a control signal to the memory device 100. Data DATA to be programmed and read data DATA may be transmitted or received between the memory controller 200 and the memory device 100.

The memory controller 200 may transmit a program command PGM, an address, and the data DATA so that the memory device 100 performs a program operation, and may activate a high voltage enable signal HVENB. The memory device 100 may perform a program operation when the high voltage enable signal HVENB is activated, and may transmit to the memory controller 200 a busy signal RB of a first logic level or state (for example, logic high) indicating that a program operation is being performed. In response to the busy signal RB of the first level, the memory controller 200 may not perform an additional operation with respect to the memory device 100.

The memory controller 200 may transmit an erase command ERS and an address so that the memory device 100 performs an erase operation, and may activate the high voltage enable signal HVENB. The memory device 100 may perform an erase operation when the high voltage enable signal HVENB is activated, and may transmit to the memory controller 200 a busy signal RB of a first level indicating that an erase operation is being performed.

When operations currently being performed, for example, the program operation and the erase operation, are completed, the memory device 100 may transmit a busy signal RB of a second logic level or state (for example, logic low) to the memory controller 200. In response to the busy signal RB of the second level, the memory controller 200 may control the memory device 100 to perform a next operation.

The memory device 100 may include a voltage switching circuit 130. The voltage switching circuit 130 may include a high voltage switching circuit 131 for switching a relatively high voltage, and a low voltage switching circuit 133 for switching a relatively low voltage. The high voltage switching circuit 131 may include high voltage transistors to withstand a high voltage, and the low voltage switching circuit 133 may include low voltage transistors.

When the high voltage enable signal HVENB is activated, the high voltage switching circuit 131 of the voltage switching circuit 130 may transmit a first voltage (for example, AVPP of FIG. 4) of a high voltage generated by a voltage generation circuit as a first line voltage to an address decoder. The address decoder of the memory device 100 may provide the first line voltage of the high voltage to a memory cell array to perform a program operation and an erase operation.

When the high voltage enable signal HVENB is inactivated, the high voltage switching circuit 131 of the voltage switching circuit 130 may transmit a second voltage (for example, AVRD of FIG. 4) of a low voltage generated by the voltage generation circuit as the first line voltage to the address decoder. The address decoder of the memory device 100 may provide the first line voltage of the low voltage to the memory cell array to perform a read operation.

When the program operation or the erase operation is completed, the memory device 100 according to embodiments of the inventive concept may discharge an output line of the high voltage switching circuit 131 that has output the first voltage AVPP of the high voltage generated by the voltage generation circuit as the first line voltage, and then may control the high voltage switching circuit 131 to output the second voltage AVRD of the low voltage as the first line voltage. Accordingly, the second voltage AVRD of the low voltage provided to the high voltage switching circuit 131 may not instantaneously increase, and the low voltage transistors of the low voltage switching circuit 133 to which the second voltage AVRD of the low voltage is provided may be protected.

Even when an unexpected abortion occurs during the program operation or the erase operation, the memory device 100 according to embodiments of the inventive concept may discharge the output line of the high voltage switching circuit 131 that has output the first voltage AVPP of the high voltage generated by the voltage generation circuit as the first line voltage, and then may control the high voltage switching circuit 131 to output the second voltage AVRD of the low voltage as the first line voltage. Accordingly, the low voltage transistors of the low voltage switching circuit 133 to which the second voltage AVRD of the low voltage is provided may be protected.

The memory controller 200 may transmit a stop signal ST and a reset signal RST to the memory device 100. In response to the stop signal ST, the memory device 100 may stop an operation currently being performed. For example, in response to the stop signal ST, the memory device 100 may stop a program operation or erase operation currently being performed.

In response to the reset signal RST, the memory device 100 may stop an operation currently being performed, and may reset setting values or control parameters. For example, in response to the reset signal RST, the memory device 100 may stop the program operation or erase operation currently being performed, and may reset setting values previously set to perform the program operation or the erase operation.

Figure 2:
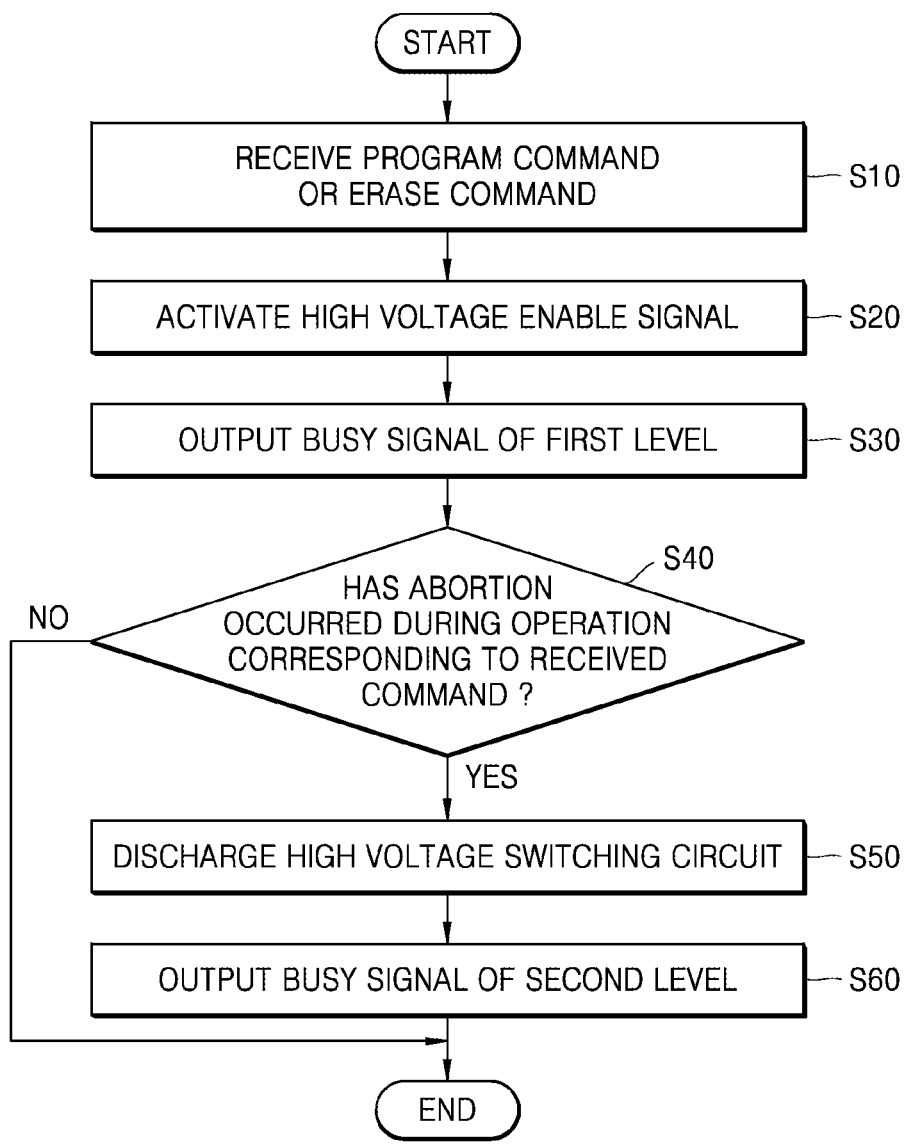
FIG. 2 is a flowchart of an operation method of a memory device according to an embodiment of the inventive concept.

FIG. 2 is a flowchart of an operation method of the memory device 100, according to an embodiment of the inventive concept.

Referring to FIGS. 1 and 2, in operation S10, the memory device 100 may receive the program command PGM or the erase command ERS. In operation S20, the high voltage enable signal HVENB may be activated.

In operation S30, as the memory device 100 performs the program operation or the erase operation, the memory device 100 may output the busy signal RB at the first logic level or state (for example, logic high). The memory device 100 may perform an operation corresponding to the received command CMD. For example, the memory device 100 may perform a program operation in response to the program command PGM or perform an erase operation in response to the erase command ERS, and may output the busy signal RB at the first logic level or state.

In operation S40, the memory device 100 may determine whether abortion has occurred. For example, when the high voltage enable signal HVENB is inactivated, the stop signal ST is received, the reset signal RST is received, or the received program command PGM or the received erase command ERS is inactivated during execution of the program operation or the erase operation, it may be determined that unexpected abortion has occurred.

In operation S50, when it is determined that unexpected abortion has occurred, the memory device 100 may discharge the high voltage switching circuit 131. According to an embodiment, the memory device 100 may discharge the output line (for example, a first output line OP1 of FIG. 4) of the high voltage switching circuit 131 of the voltage switching circuit 130. The high voltage switching circuit 131 may be a switching circuit that provides different levels of voltages to the memory cell array according to operations performed by the memory device 100 by switching a plurality of voltages, or may be a switching circuit that provides a high voltage to the memory cell array by providing a relatively high voltage to the address decoder during the program operation or the erase operation.

In operation S60, as the discharging is completed, the memory device 100 may output the busy signal RB of the second level to the memory controller 200. In response to the busy signal RB at the second logic level or state (e.g., logic low), the memory controller 200 may determine that an operation being performed by the memory device 100 has been completed, and may control the memory device 100 to perform a next operation.

Figure 3:
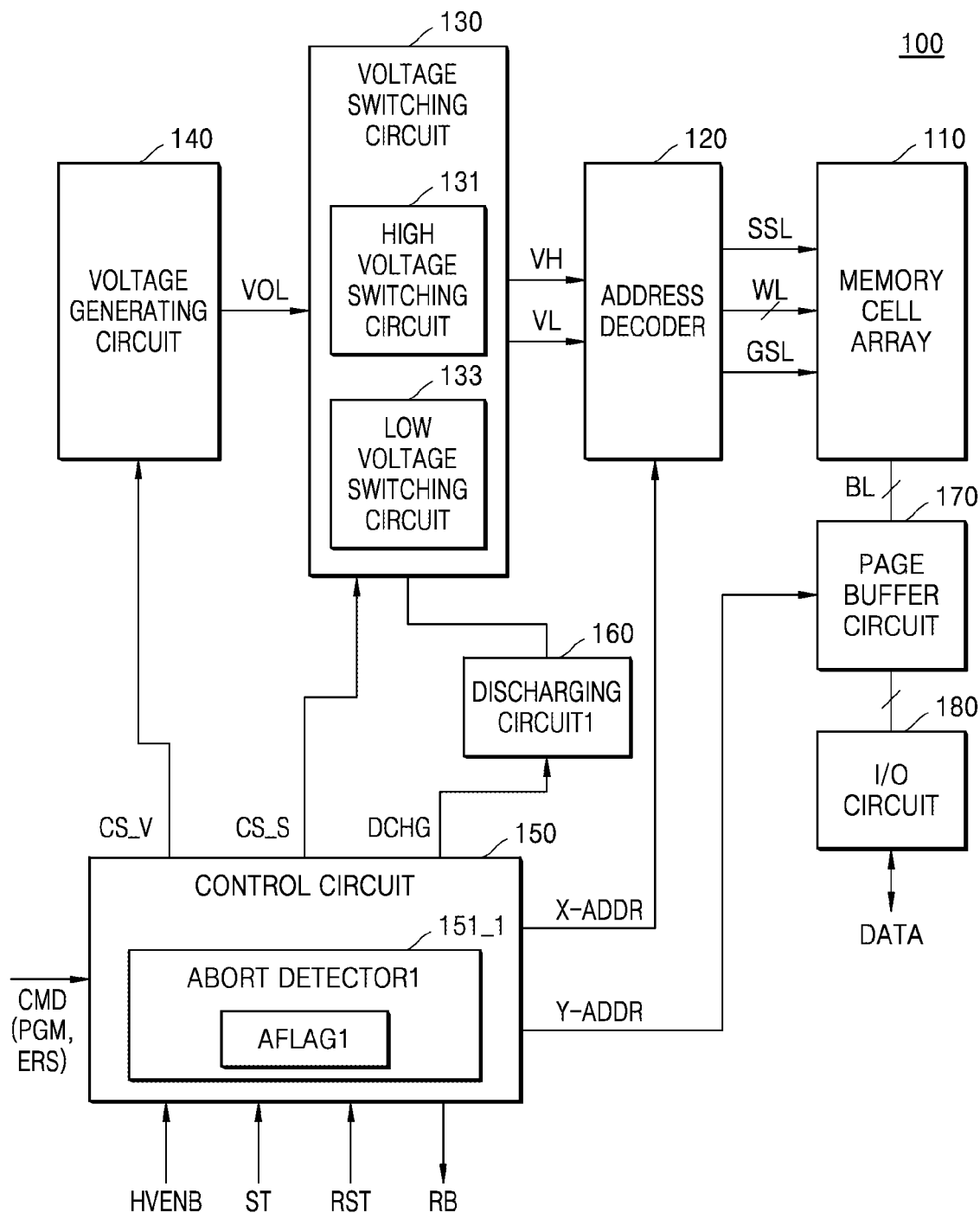
FIG. 3 is a block diagram of a memory device according to an embodiment of the inventive concept.

FIG. 3 is a block diagram of a memory device 100 according to an embodiment of the inventive concept, which is an example of the memory device 100 of FIG. 1.

Referring to FIG. 3, the memory device 100 may include a memory cell array 110, an address decoder 120, a voltage switching circuit 130, a voltage generation circuit 140, a control circuit 150, a first discharge circuit 160, a page buffer circuit 170, and an I/O circuit 180.

The memory cell array 110 may be connected to word lines WL, string selection lines SSL, ground selection lines GSL, and bit lines BL. The memory cell array 110 may be connected to the address decoder 120 via the word lines WL, the string selection lines SSL, and the ground selection lines GSL, and may be connected to the page buffer circuit 170 via the bit lines BL. The memory cell array 110 may include a plurality of memory blocks.

According to an embodiment, the memory cell array 110 may be a three-dimensional (3D) memory cell array formed on a substrate to have a 3D structure (or a vertical structure). In such embodiments, the memory cell array 110 may include vertical memory cell strings including a plurality of memory cells stacked on each other. According to another embodiment, the memory cell array 110 may be a two-dimensional (2D) memory cell array formed on a substrate to have a 2D structure (or a horizontal structure).

The memory cell array 110 may include a plurality of memory cells. According to an embodiment, the memory cell array 110 may include a plurality of flash memory cells. However, embodiments of the inventive concept are not limited thereto, and the plurality of memory cells may be resistive memory cells, such as resistive random access memory (ReRAM), phase change RAM (PRAM), or magnetic RAM (MRAM).

The address decoder 120 may select one memory block from the plurality of memory blocks of the memory cell array 110, select one word line from the word lines WL of the selected memory block, and select one string selection line from among a plurality of string selection lines SSL. The address decoder 120 may receive a first line voltage VH and a second line voltage VL from the voltage switching circuit 130 and apply the received first line voltage VH and the received second line voltage VL to the word lines WL.

The voltage switching circuit 130 may transmit, to the address decoder 120, voltages used for performing an operation of the memory device 100. The voltage switching circuit 130 may receive a plurality of voltages VOL from the voltage generation circuit 140 and may transmit the plurality of voltages VOL to the address decoder 120 via a switching operation.

The voltage switching circuit 130 may include the high voltage switching circuit 131 and the low voltage switching circuit 133. The high voltage switching circuit 131 may switch a relatively high voltage in response to a switching control signal CS_S, may output the first line voltage VH as a switching result to the first output line, and the low voltage switching circuit 133 may switch a relatively low voltage in response to the switching control signal CS_S and may output the second line voltage VL as a switching result to the second output line.

The voltage generator 140 may generate various types of voltages VOL for performing program, read, and erase operations with respect to the memory cell array 110 based on a voltage control signal CS_V. For example, the voltage generation circuit 140 may generate a word line voltage, a string selection line voltage, a ground selection line voltage, a source line voltage, and the like.

Figure 4:
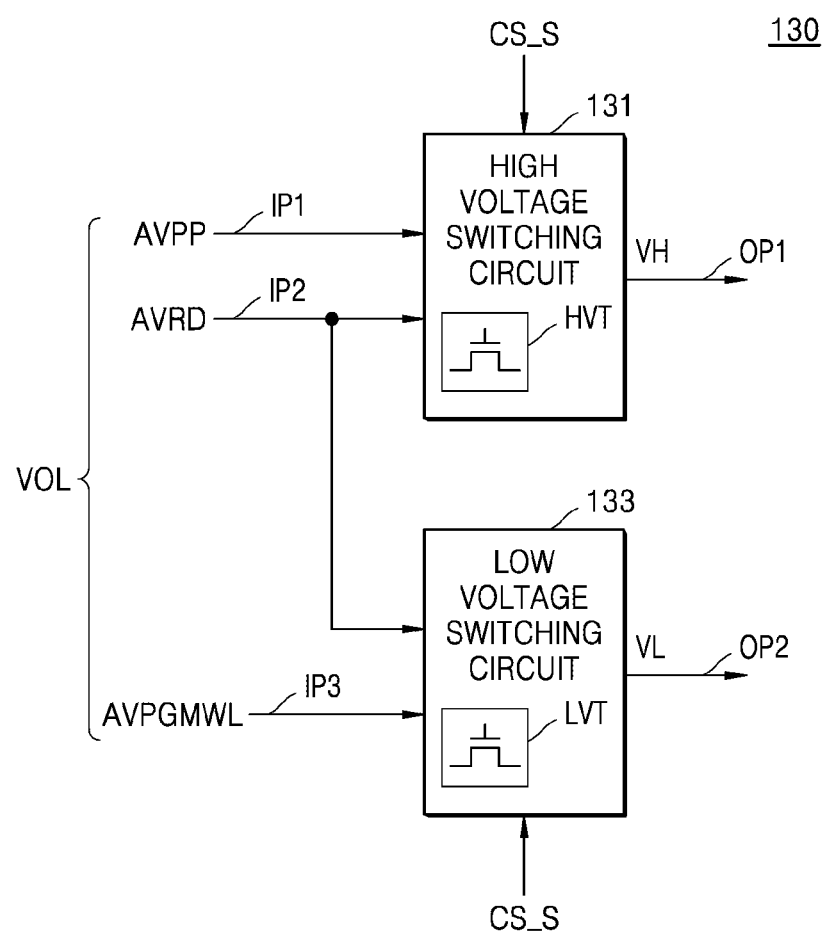
FIG. 4 is a block diagram of a voltage switching circuit of a memory device according to an embodiment of the inventive concept.

According to an embodiment, the voltage generation circuit 140 may generate the first voltage AVPP, the second voltage AVRD, and a third voltage AVPGMWL of FIG. 4. For example, the first voltage AVPP may have a higher level (or greater magnitude) than the second voltage AVRD, and the second voltage AVRD may have a higher level (or greater magnitude) than the third voltage AVPGMWL.

The control circuit 150 may output various control signals for performing program, read, and erase operations with respect to the memory cell array 110, based on the command CMD, the address, the high voltage enable signal HVENB, the stop signal ST, and the reset signal RST. The control circuit 150 may provide a row address X-ADDR to the address decoder 120, may provide a column address Y-ADDR to the page buffer circuit 170, and may provide the voltage control signal CS_V to the voltage generation circuit 140. The control circuit 150 may provide the switching control signal CS_S to the voltage switching circuit 130, and may provide a discharge control signal DCHG to the first discharge circuit 160.

The control circuit 150 may include a first abort detector 151_1. When abortion occurs during the program operation or the erase operation, the first abort detector 151_1 may detect the occurrence of abortion and generate a first abort flag AFLAG1. The control circuit 150 may generate the discharge control signal DCHG according to the generated first abort flag AFLAG1.

According to an embodiment, when a first type of abortion occurs during the program operation or the erase operation, the first abort detector 151_1 may generate the first abort flag AFLAG1. The first type of abortion may refer to abortion in which, when the memory device 100 is aborted by an externally-received signal, a time period for discharging the high voltage switching circuit 131 may be secured, and the high voltage switching circuit 131 may be discharged by the first discharge circuit 160 implemented by using an analog circuit or a pump circuit. For example, the first type of abortion may refer to reception of a signal instructing abortion of the program operation or the erase operation from a memory controller when a setting value, for example, a timing setting value, is maintained. According to an embodiment, when the high voltage enable signal HVENB is inactivated or the stop signal ST is received, the first abort detector 151_1 may sense the first type of abortion by generating the first abort flag AFLAG1.

The first discharge circuit 160 may discharge the voltage switching circuit 130 during a set time period in response to the discharge control signal DCHG. For example, when the program operation or the erase operation is completed or the first type of abortion occurs during the program operation or the erase operation, the control circuit 150 may generate the discharge control signal DCHG and provide the same to the first discharge circuit 160. The first discharge circuit 160 may discharge the first output line for outputting the first line voltage VH of the high voltage switching circuit 131 for a set time period in response to the discharge control signal DCHG.

The page buffer circuit 170 may operate as a write driver or a sense amplifier according to different operation modes. During a read operation, the page buffer circuit 170 may sense the bit line BL of a selected memory cell under the control of the control circuit 150. Sensed data may be stored in latches included in the page buffer circuit 170. The page buffer circuit 170 may dump the data stored in the latches to the I/O circuit 180 under the control of the control circuit 150.

The I/O circuit 180 may temporarily store data DATA received from the outside of the memory device 100 via an I/O line I/O. The I/O circuit 180 may temporarily store read data of the memory device 100, and may output the read data to the outside via the I/O line I/O at a designated time point.

FIG. 4 is a block diagram of the voltage switching circuit 130 of the memory device 100 according to an embodiment of the inventive concept.

Referring to FIGS. 3 and 4, the voltage switching circuit 130 may include a high voltage switching circuit 131 for switching a relatively high voltage, and a low voltage switching circuit 133 for switching a relatively low voltage. The high voltage switching circuit 131 may output the first line voltage VH to a first output line OP1 via a switching operation, and the low voltage switching circuit 133 may output the second line voltage VL to a second output line OP2.

The high voltage switching circuit 131 may receive the first voltage AVPP via a first input line IP1, and may receive the second voltage AVRD via a second input line IP2. According to an embodiment, the first voltage AVPP may have a higher level (or greater magnitude) than the second voltage AVRD. The first voltage AVPP and the second voltage AVRD may be some of the voltages VOL generated by the voltage generation circuit 140.

In response to the switching control signal CS_S, the high voltage switching circuit 131 may electrically connect the first input line IP1 to the first output line OP1 and output the first voltage AVPP as the first line voltage VH. In other embodiments, in response to the switching control signal CS_S, the high voltage switching circuit 131 may electrically connect the second input line IP2 to the first output line OP1 and output the second voltage AVRD as the first line voltage VH. According to an embodiment, while the memory device is executing a program operation or an erase operation, the high voltage switching circuit 131 may electrically connect the first input line IP1 to the first output line OP1, and while the memory device is executing a read operation, the high voltage switching circuit 131 may electrically connect the second input line IP2 to the first output line OP1.

The low voltage switching circuit 133 may receive the second voltage AVRD via the second input line IP2, and may receive the third voltage APGMWL via a third input line IP3. According to an embodiment, the second voltage AVRD may have a higher level (or greater magnitude) than the third voltage APGMWL, but embodiments of the inventive concept are not limited thereto. The third voltage APGMWL may have a higher level (or greater magnitude) than the second voltage AVRD and may have a lower level (or smaller magnitude) than the first voltage AVPP. The third voltage APGMWL may be one of the voltages VOL of FIG. 3 generated by the voltage generation circuit 140. For example, the first voltage AVPP may be 12V or 8V, the second voltage AVRD may be 2V, and the third voltage AVPGMWL may be 1V.

In response to the switching control signal CS_S, the low voltage switching circuit 133 may electrically connect the second input line IP2 to the second output line OP2 and output the second voltage AVRD as the second line voltage VL. Alternatively, in response to the switching control signal CS_S, the low voltage switching circuit 133 may electrically connect the third input line IP3 to the second output line OP2 and output the third voltage APGMWL as the second line voltage VL. According to an embodiment, while the memory device is executing a program operation or an erase operation, the low voltage switching circuit 133 may electrically connect the third input line IP3 to the second output line OP2, and, while the memory device is executing a read operation, the low voltage switching circuit 133 may electrically connect the second input line IP2 to the second output line OP2. Accordingly, a maximum level (or magnitude) of the second line voltage VL output by the low voltage switching circuit 133 may be lower than that of the first line voltage VH output by the high voltage switching circuit 131.

The high voltage switching circuit 131 may include a plurality of high voltage transistors HVT, and the low voltage switching circuit 133 may include a plurality of low voltage transistors LVT. For example, the high voltage switching circuit 131 may include level shifters composed of the plurality of high voltage transistors HVT, and the low voltage switching circuit 133 may include level shifters composed of the plurality of low voltage transistors LVT.

The high voltage switching circuit 131 may withstand a relatively high voltage because a relatively high level (or magnitude) of voltage is input and output, and may include the plurality of high voltage transistors HVT, which are capable of operating in a wide voltage range. According to an embodiment, the plurality of high voltage transistors HVT may include an active area with a larger width (a width in a direction parallel to a substrate) than the plurality of low voltage transistors LVT. According to an embodiment, the plurality of high voltage transistors HVT may include a gate line with a larger width (a width in a direction parallel to a substrate) than the plurality of low voltage transistors LVT. According to an embodiment, the plurality of high voltage transistors HVT may include a gate line with a larger thickness (a thickness in a direction perpendicular to a substrate) than the plurality of low voltage transistors LVT. According to an embodiment, the plurality of high voltage transistors HVT may include a gate insulation layer with a larger thickness (a thickness in a direction perpendicular to a substrate) than the plurality of low voltage transistors LVT.

The high voltage switching circuit 131 and the low voltage switching circuit 133 may be electrically connected to the second input line IP2 and may receive the second voltage AVRD. Accordingly, when the high voltage switching circuit 131 electrically connects the second input line IP2 to the first output line OP1 without discharging the first output line OP1 after electrically connecting the first input line IP1 to the first output line OP1, the second voltage AVRD of the second input line IP2 may instantaneously increase or increase in response thereto. A peak voltage where the second voltage AVRD of the second input line IP2 instantaneously or rapidly increases may damage the plurality of low voltage transistors LVT of the low voltage switching circuit 133. When the program operation or the erase operation is aborted unexpectedly, the memory device 100 according to the inventive concept may prevent or reduce an instantaneous or rapid increase in the voltage of the second input line IP2 by discharging the first output line OP2 of the high voltage switching circuit 131 via the discharge circuit 160, and may prevent or reduce damage to the plurality of low voltage transistors LVT.

Figure 5:
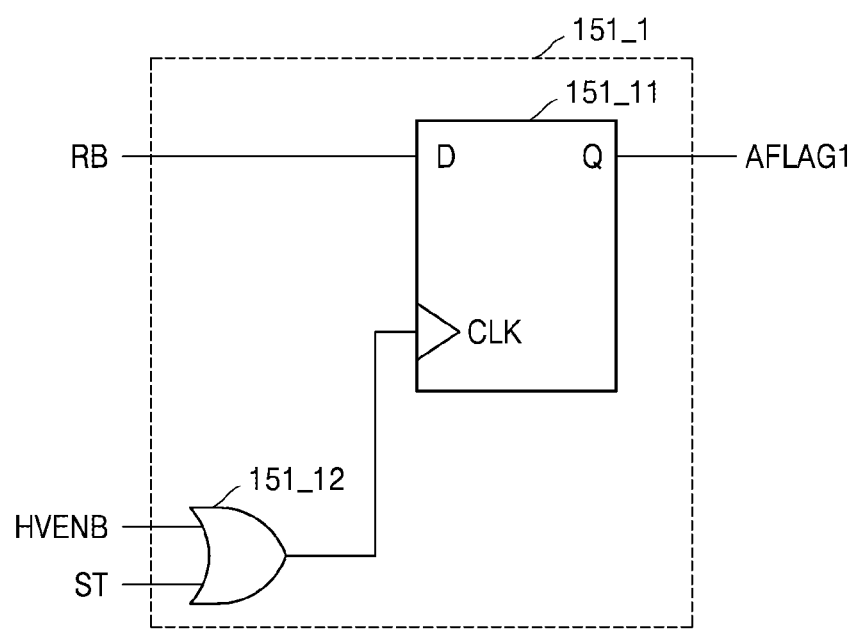
FIG. 5 is a block diagram of a first abort detector of a memory device according to an embodiment of the inventive concept.

FIG. 5 is a block diagram of the first abort detector 151_1 of the memory device 100 according to an embodiment of the inventive concept.

Referring to FIGS. 3 and 5, the first abort detector 151_1 may generate the first abort flag AFLAG1 corresponding to the busy signal RB in response to at least one of the high voltage enable signal HVENB and the stop signal ST. According to an embodiment, the first abort detector 151_1 may include a latch circuit 151_11 and an OR gate 151_12.

The busy signal RB may be input to an input terminal D of the latch circuit 151_11, and the first abort flag AFLAG1 may be input to an output terminal Q of the latch circuit 151_11. The high voltage enable signal HVENB and the stop signal ST may be input to the OR gate 151_12, and a signal output by the OR gate 151_12 may be input as a clock signal CLK of the latch circuit 151_11. Accordingly, when at least one of the high voltage enable signal HVENB and the stop signal ST is logic high ('1'), the latch circuit 151_11 may output the first abort flag AFLAG1 corresponding to the busy signal RB. In other words, the latch circuit 151_11 may output the busy signal RB as the first abort flag AFLAG1.

According to an embodiment, the first abort detector 151_1 may be reset using a reset signal (for example, RST of FIG. 1). For example, the latch circuit 151_11 may be reset in response to the reset signal (for example, RST of FIG. 1).

Figure 6:
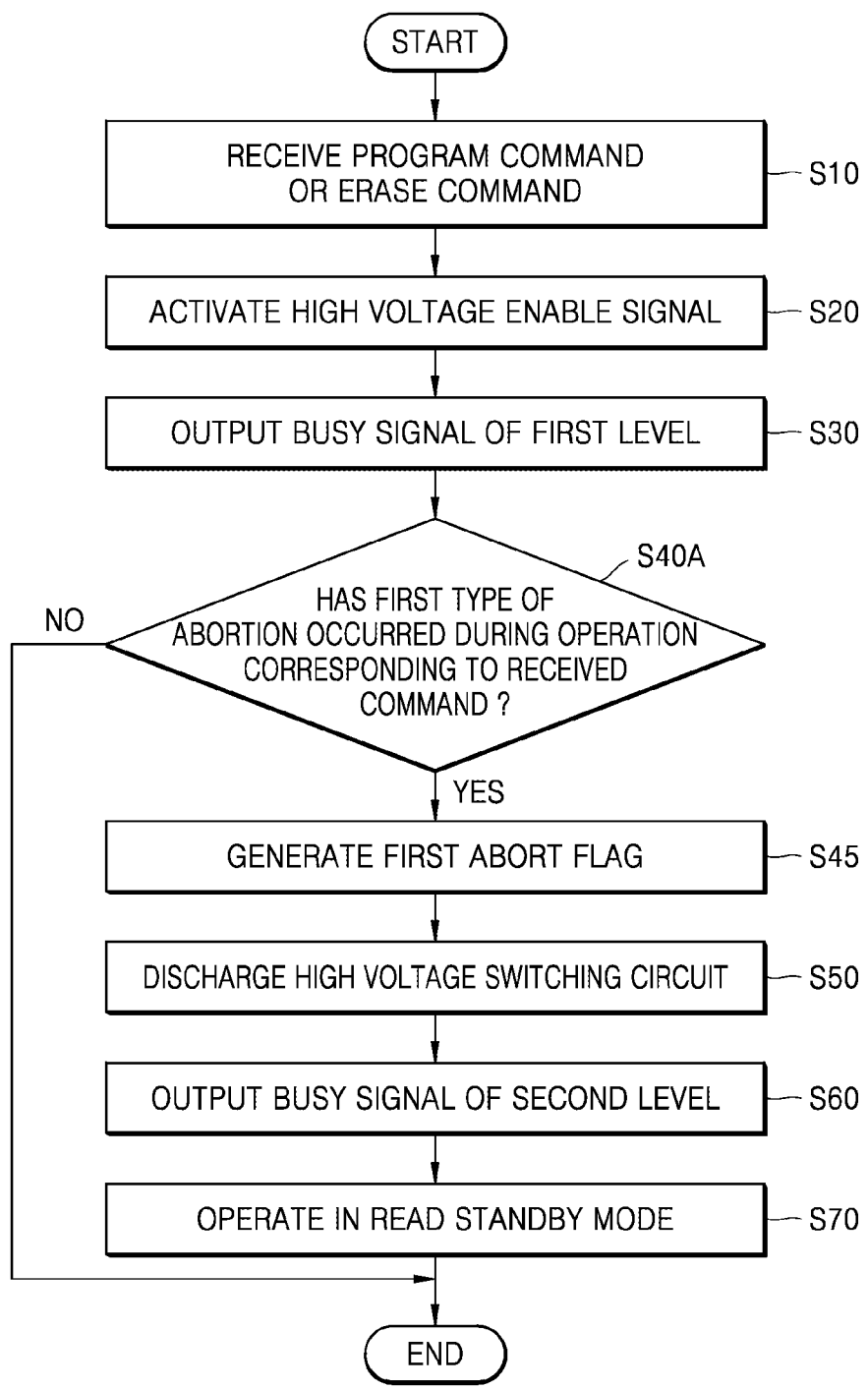
FIG. 6 is a flowchart of an operation method of a memory device according to an embodiment of the inventive concept.
Figure 7:
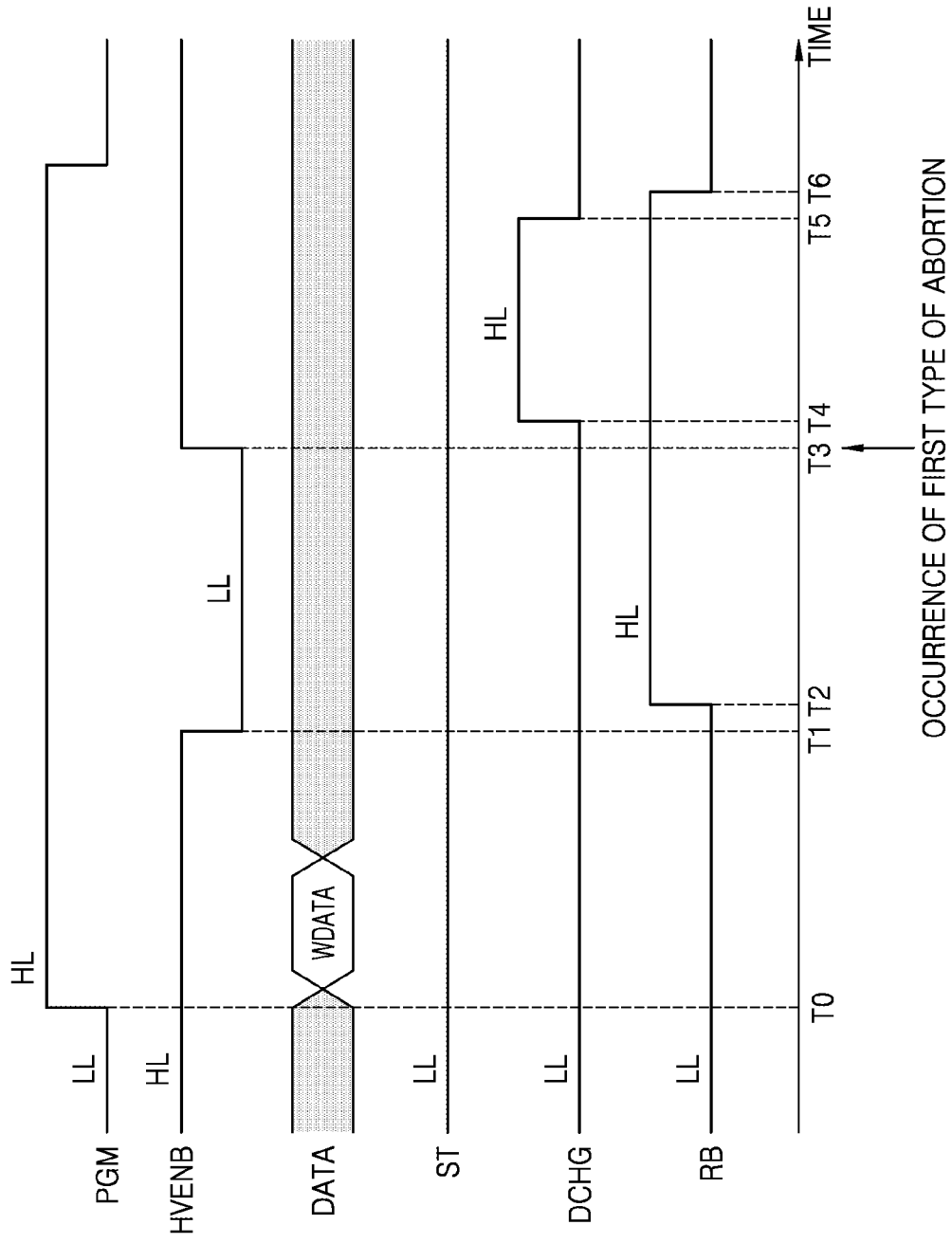
FIGS. 7 and 8 are timing diagrams that illustrate an operation method of a memory device, according to an embodiment of the inventive concept.
Figure 8:
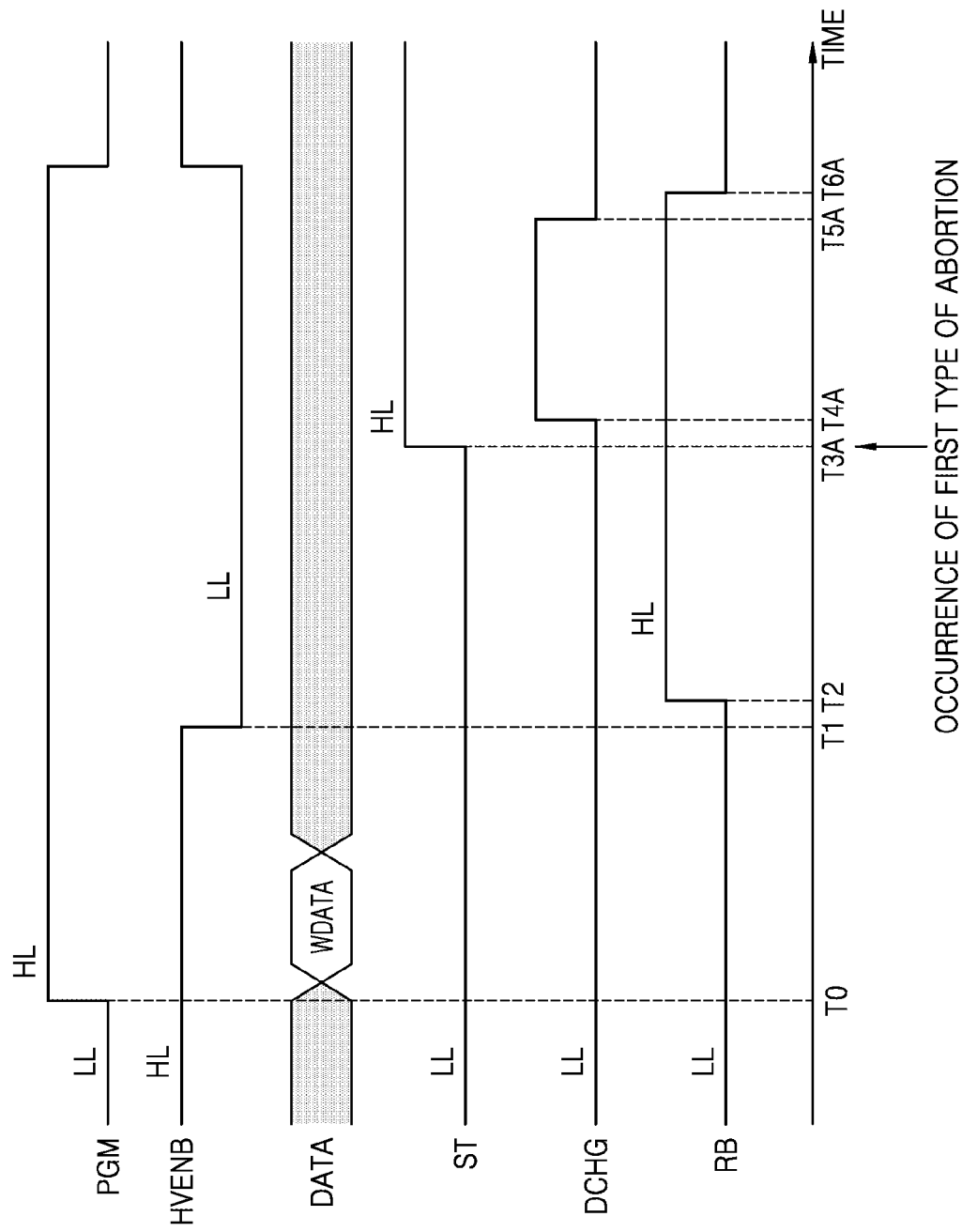

FIG. 6 is a flowchart of an operation method of a memory device according to an embodiment of the inventive concept. FIGS. 7 and 8 are timing diagrams that illustrate an operation method of a memory device, according to an embodiment of the inventive concept. The operation method of the memory device of FIG. 6 is an example of the operation method of the memory device of FIG. 1.

Referring to FIGS. 6, 7, and 8, in operation S10, the memory device (for example, 100 of FIG. 3) may receive the program command PGM or the erase command ERS. In operation S20, the high voltage enable signal HVENB may be activated. For example, the memory device 100 may receive the program command PGM at a first time T0, and the high voltage enable signal HVENB may be activated at a second time T1. In other words, the memory device 100 may receive a program command PGM transitioning from logic low LL to logic high HL, at the first time T0, and may receive a high voltage enable signal transitioning from logic high HL to logic low LL, at the second time T1. At this time, the memory device 100 may receive write data WDATA. Although the memory device 100 receives the program command PGM in FIGS. 7 and 8, embodiments of the inventive concept are not limited thereto. Even when the memory device 100 receives the erase command ERS, the above description, except for the write data WDATA, with reference to FIGS. 7 and 8 may be equally applied.

In operation S30, as the memory device 100 performs the program operation, the memory device 100 may output the busy signal RB at the first level or logic state (for example, logic high) to a memory controller. For example, the memory device 100 may output a busy signal RB transiting from logic low LL to logic high HL, at a third time T2.

In operation S40, the memory device 100 may determine whether the first type of abortion has occurred. According to an embodiment, when the high voltage enable signal HVENB is inactivated or the stop signal ST is received during the program operation or the erase operation, the memory device 100 may determine that the first type of abortion has occurred.

In detail, referring to FIG. 7, while the memory device 100 is outputting a busy signal at a first level or logic state HL to the memory controller, the high voltage enable signal HVENB may be inactivated at a fourth time T3. For example, the memory device 100 may receive the high voltage enable signal HVENB transitioning from logic low LL to logic high HL at the fourth time T3.

Referring to FIG. 8, while the memory device 100 is outputting the busy signal at the first level or logic state HL to the memory controller, the memory device 100 may receive the stop signal ST at a fourth time T3A. For example, the memory device 100 may receive a stop signal ST transitioning from logic low LL to logic high HL at the fourth time T3A.

Referring back to FIGS. 6, 7, and 8, in operation S45, when it is determined that the first type of abortion has occurred, the memory device 100 may generate a first abort flag (for example, AFLAG1 of FIG. 3). The memory device 100 may generate the discharge control signal DCHG according to the generated first abort flag AFLAG1. For example, the memory device 100 may generate a discharge control signal DCHG at a logic high HL during a time period between a fifth time T4 or T4A and a sixth time T5 or T5A.

In operation S50, the memory device 100 may discharge a high voltage switching circuit (for example, 131 of FIG. 3) of a voltage switching circuit (for example, 130 of FIG. 3). According to an embodiment, the memory device 100 may discharge the output line (for example, the first output line OP1 of FIG. 4) of the high voltage switching circuit 131. The memory device 100 may discharge the output line OP1 of the high voltage switching circuit 131 of the voltage switching circuit 130 during a time period between the fifth time T4 or T4A and the sixth time T5 or TSA.

When the discharge operation is completed, the memory device 100 may complete an operation according to the command CMD received in operation S10. In operation S60, as the discharge operation is completed, the memory device 100 may output the busy signal RB at the second level or logic state (for example, logic low LL) to the memory controller. The memory device 100 may output the busy signal RB transitioning from logic high HL to logic low LL, at a seventh time T6 or T6A.

After the memory device 100 outputs the busy signal RB at the second level or logic state LL to the memory controller, the memory device 100 may operate in a read standby mode in preparation for performing a read operation. For example, in the read standby mode, the high voltage switching circuit 131 may connect a second input line (for example, IP2 of FIG. 4) to the output line OP1, and may output a second voltage (for example, AVRD of FIG. 4) as a first line voltage (for example, VH of FIG. 4). When the memory controller receives the busy signal RB at the second level or logic state LL from the memory device 100, the memory controller may transmit a command CMD for performing a next operation.

When the first type of abortion occurs during the program operation or the erase operation, the memory device 100 may generate the first abort flag AFLAG1 and output the discharge control signal DCHG for operating a first discharge circuit (for example, 160 of FIG. 3), thereby discharging the voltage switching circuit 130. Thus, the abortion of the program operation or the erase operation may reduce or prevent damage to a transistor within the voltage switching circuit 130.

Figure 9:
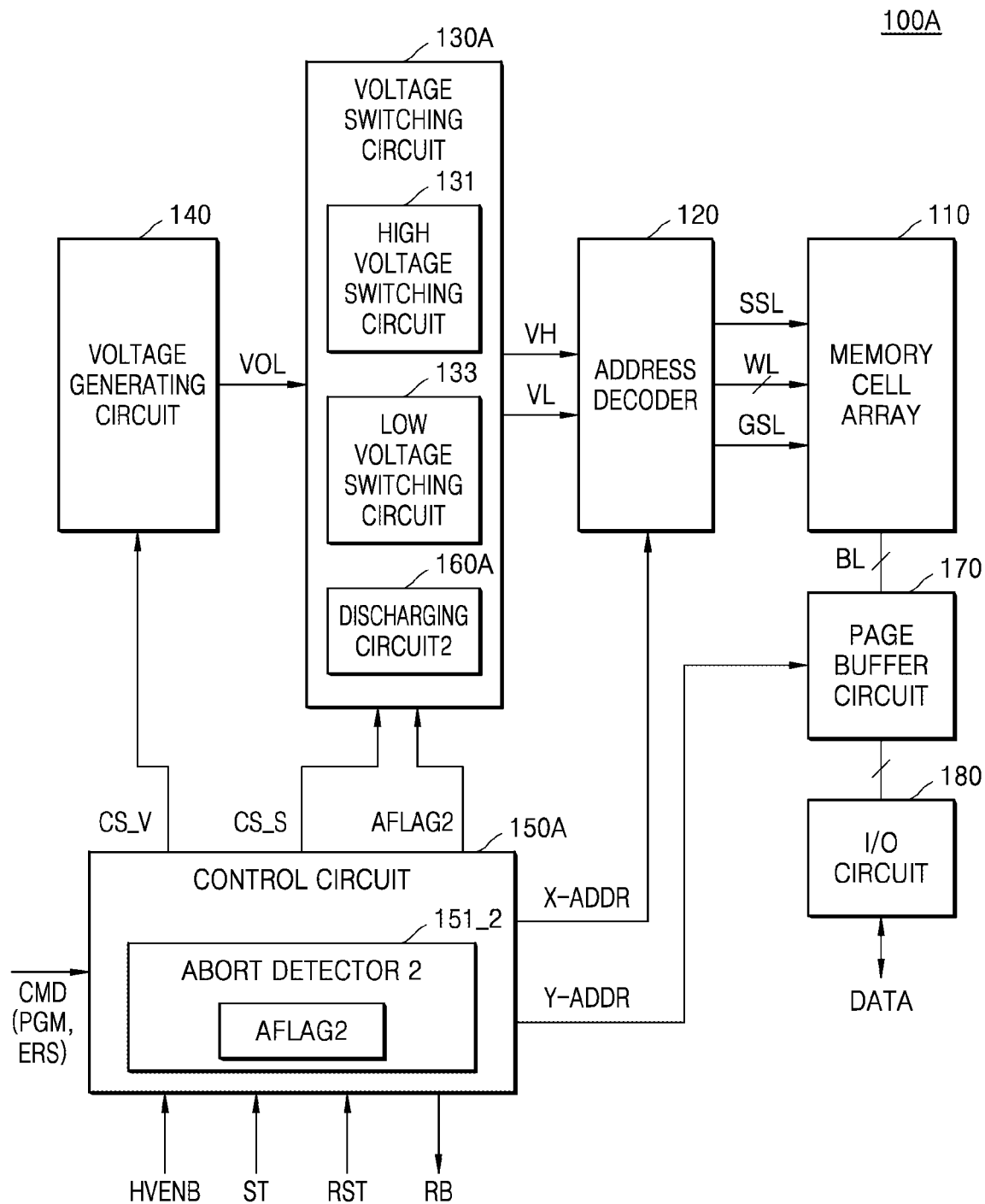
FIG. 9 is a block diagram of a memory device according to an embodiment of the inventive concept.
Figure 10:
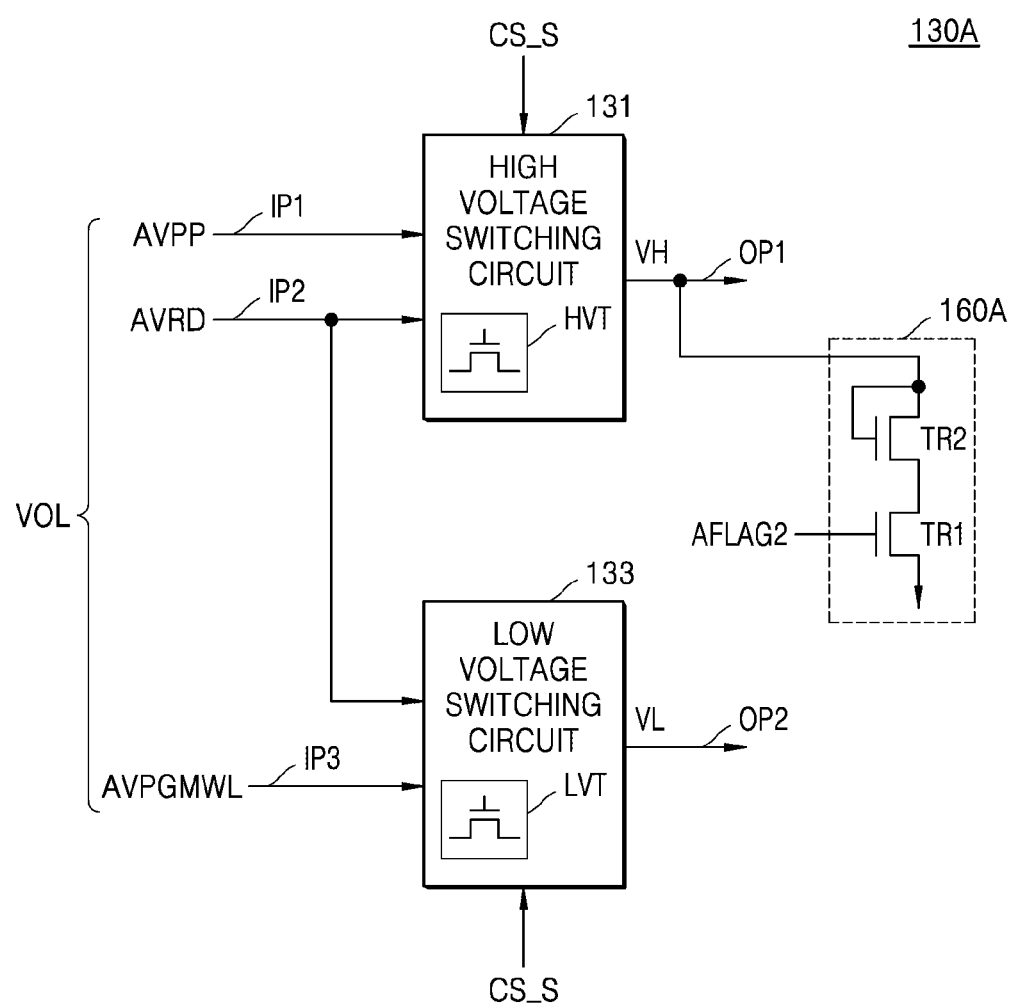
FIG. 10 is a block diagram that illustrates an example of a voltage switching circuit of FIG. 9.
Figure 11:
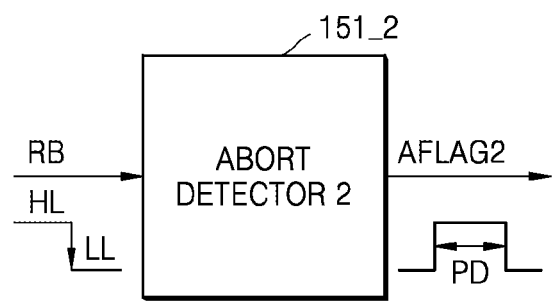
FIG. 11 is a block diagram that illustrates an example of a second abort detector of FIG. 9.

FIG. 9 is a block diagram of a memory device 100A according to an embodiment of the inventive concept. FIG. 10 is a block diagram that illustrates an example of a voltage switching circuit 130A of FIG. 9. FIG. 11 is a block diagram that illustrates an example of a second abort detector 151_2 of FIG. 9. Reference numerals of FIG. 9 that are the same as those of FIG. 3 will not be described again.

Referring to FIGS. 9 and 10, the memory device 100A may include the memory cell array 110, the address decoder 120, the voltage switching circuit 130A, the voltage generation circuit 140, a control circuit 150A, the page buffer circuit 170, and the I/O circuit 180. Although not shown in FIG. 9, the memory device 100A may further include the first discharge circuit 160 of FIG. 3.

The voltage switching circuit 130A may transmit, to the address decoder 120, voltages used for performing an operation of the memory device 100A. The voltage switching circuit 130A may include the high voltage switching circuit 131, the low voltage switching circuit 133, and a second discharge circuit 160A. The second discharge circuit 160A may discharge the high voltage switching circuit 131 in response to a second abort flag AFLAG2.

The second discharge circuit 160A may be electrically connected to the first output line OP1 of the high voltage switching circuit 131 and may discharge the first output line OP1. According to an embodiment, the second discharge circuit 160A may include a plurality of N-type transistors, namely, first and second N-type transistors TR1 and TR2, and the first N-type transistor TR1 may be switched by the second abort flag AFLAG2. However, embodiments of the inventive concept are not limited thereto. The second discharge circuit 160A may be composed of any of various circuits.

The voltage switching circuit 130A may include the second discharge circuit 160A, which is directly connected to the high voltage switching circuit 131 to quickly discharge the high voltage switching circuit 131 in response to the second abort flag AFLAG2.

When a second type of abortion is sensed, the control circuit 150A may transmit the busy signal RB of the second level to the memory controller. The control circuit 150A may notify that the program operation or the erase operation currently being performed by the memory device 100A has been aborted by transmitting the busy signal RB, which is changed from the first level or logic state to the second level or logic state, to the memory controller.

The second type of abortion may refer to abortion in which, when the memory device 100A is aborted by an externally-received signal, a time period taken for the high voltage switching circuit 131 to be discharged by a first discharge circuit (for example, 160 of FIG. 3) included outside the switching circuit 130 and implemented by using an analog circuit or a pump circuit may not be secured. For example, the second type of abortion may refer to reception, from the memory controller, of a signal that resets a setting value, in particular, a timing setting value. According to an embodiment, the control circuit 150A may determine that the second type of abortion has occurred, when the reset signal RST is received from the memory controller or when the received program command PGM or the received erase command ERS is inactivated, during a program operation or an erase operation.

Referring to FIGS. 9 and 11, the control circuit 150A may include a second abort detector 151_2. When abortion occurs during the program operation or the erase operation, the second abort detector 151_2 may detect the occurrence of abortion and generate the second abort flag AFLAG2. For example, when the second type of abortion occurs during the program operation or the erase operation, the second abort detector 151_2 may generate the second abort flag AFLAG2. For example, when the reset signal RST is received from the memory controller or when the received program command PGM or the received erase command ERS is inactivated, the control circuit 150A may transmit the busy signal RB at the second level or logic state to the memory controller, and the second abort detector 151_2 may generate the second abort flag AFLAG2 according to a change in the level of the busy signal RB. According to an embodiment, abort detector 151_2 may detect a time point when the busy signal RB transitions from the first level or logic state (for example, logic high HL) to the second level or logic state, namely, a falling edge, thereby generating a second abort flag AFLAG2 having an on-section of a certain time period PD.

When the second type of abortion occurs, generally, it may be difficult to discharge the high voltage switching circuit 131 by using the first discharge circuit 160 implemented by using an analog circuit or a pump circuit. Thus, the control circuit 150A may transmit the second abort flag AFLAG2 generated by the second abort detector 151_2 and having a certain on-section to the second discharge circuit 160A included in the voltage switching circuit 130A. The second discharge circuit 160A may directly discharge the first output line OP1 of the high voltage switching circuit 131 in response to the second abort flag AFLAG2.

Figure 12:
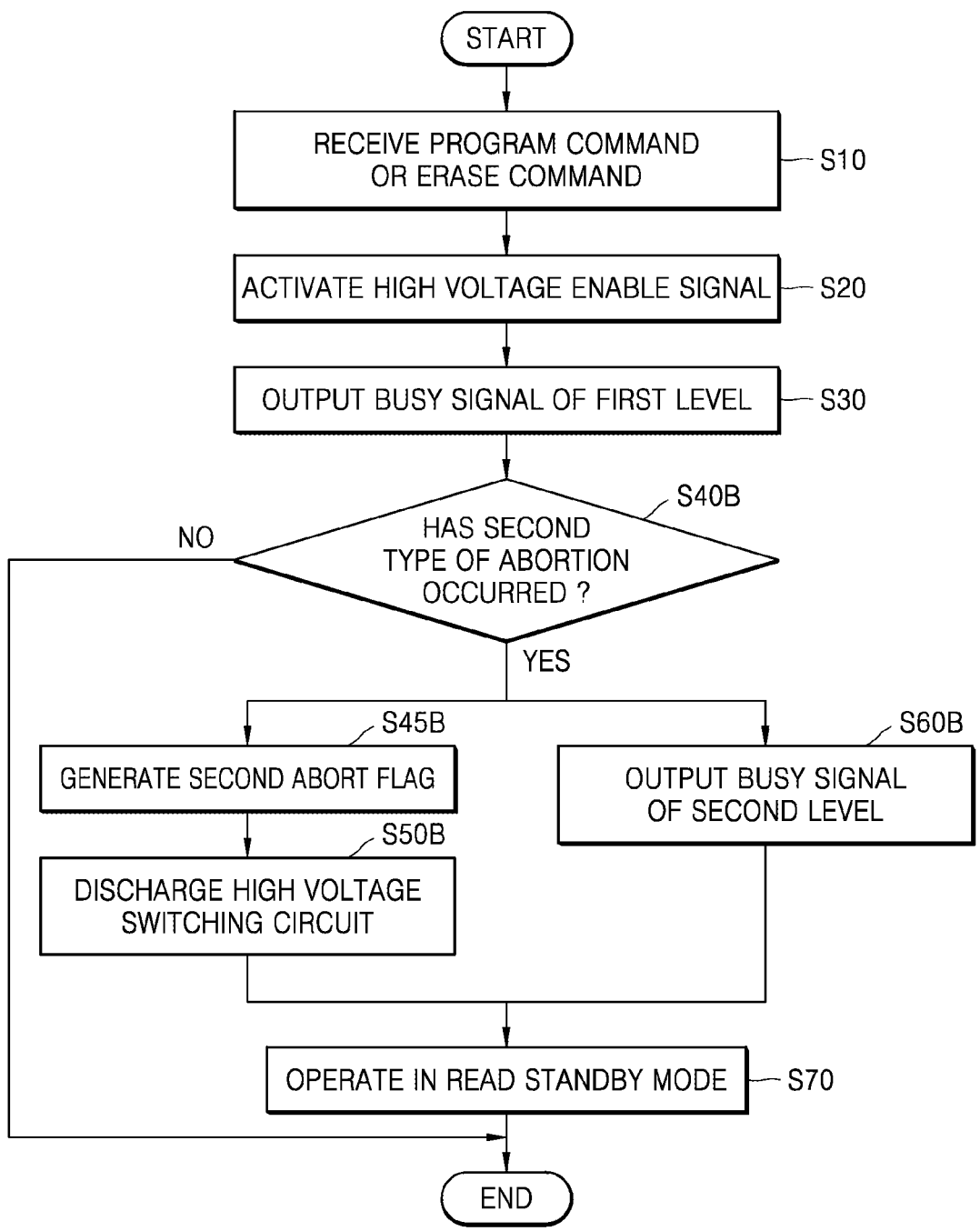
FIG. 12 is a flowchart of an operation method of a memory device, according to an embodiment of the inventive concept.
Figure 13:
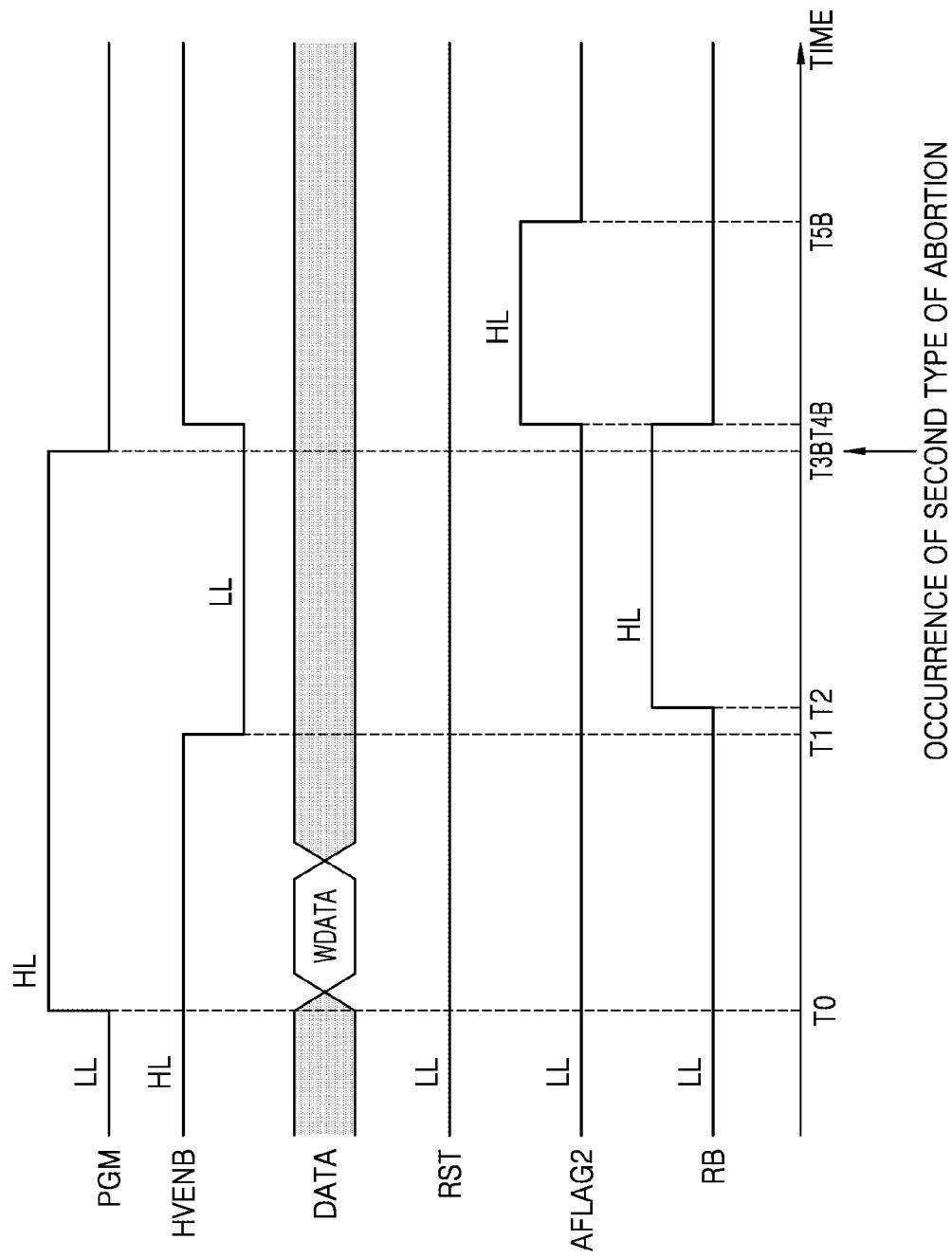
FIGS. 13 and 14 are timing diagrams that illustrate an operation method of a memory device, according to an embodiment of the inventive concept.
Figure 14:
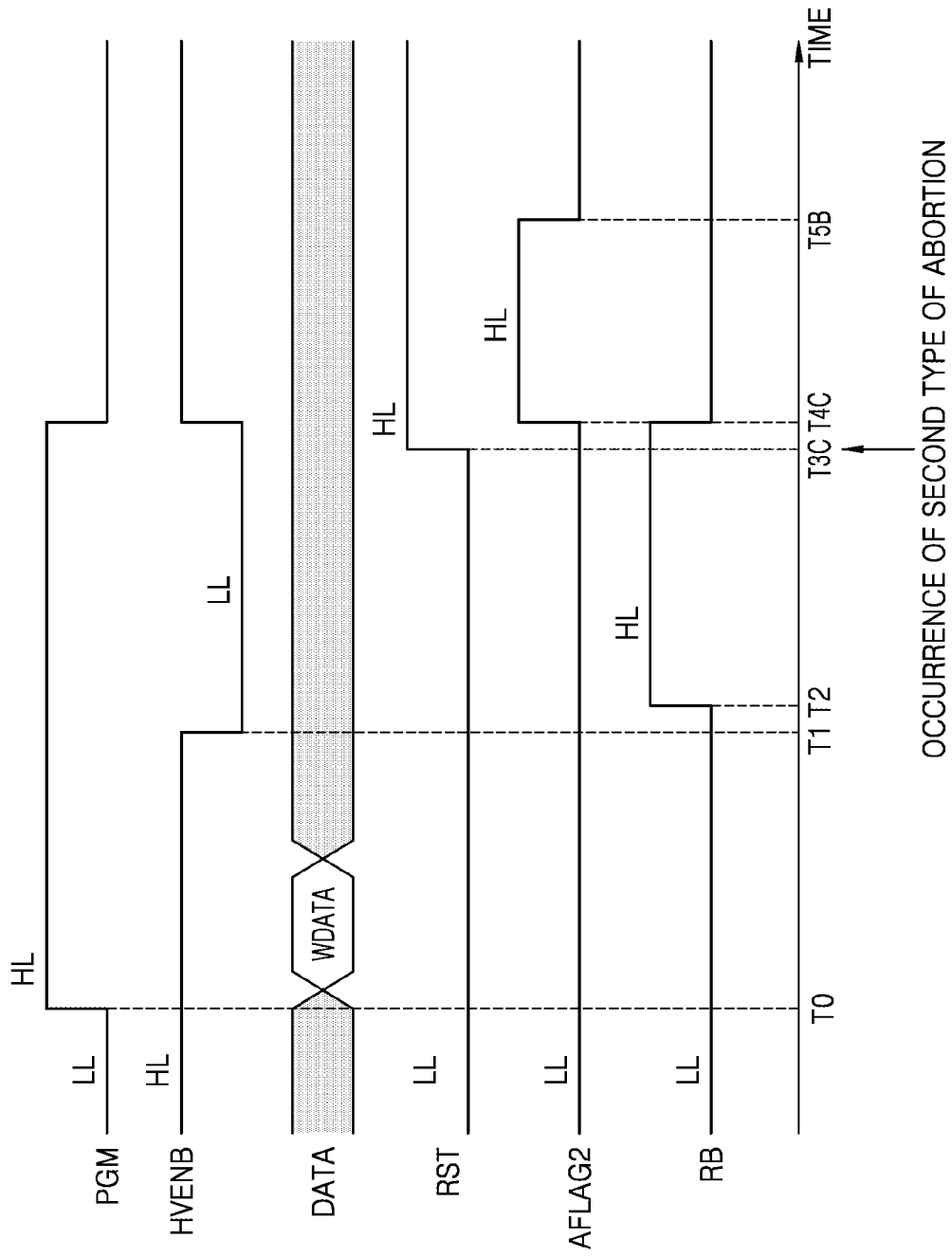

FIG. 12 is a flowchart of an operation method of a memory device 100, according to an embodiment of the inventive concept. FIGS. 13 and 14 are timing diagrams that illustrate an operation method of a memory device, according to an embodiment of the inventive concept. The operation method of the memory device of FIG. 12 is an example of the operation method of the memory device of FIG. 2.

Referring to FIGS. 12, 13, and 14, in operation S10, the memory device (for example, 100A of FIG. 9) may receive the program command PGM or the erase command ERS. In operation S20, the high voltage enable signal HVENB may be activated. For example, the memory device 100A may receive the program command PGM at a first time T0, and the high voltage enable signal HVENB may be activated at a second time T1. In other words, the memory device 100A may receive a program command PGM transitioning from logic low LL to logic high HL, at the first time T0, and may receive a high voltage enable signal transitioning from logic high HL to logic low LL, at the second time T1. At this time, the memory device 100A may receive write data WDATA. Although the memory device 100A receives the program command PGM in FIGS. 13 and 14, embodiments of the inventive concept are not limited thereto. Even when the memory device 100 receives the erase command ERS, the above description, except for the write data WDATA with reference to FIGS. 13 and 14, may be equally applied.

In operation S30, as the memory device 100A performs the program operation, the memory device 100 may output the busy signal RB at the first level or logic state (for example, logic high HL) to a memory controller. For example, the memory device 100A may output a busy signal RB transitioning from logic low LL to logic high HL at a third time T2.

In operation 540B, the memory device 100A may determine whether the second type of abortion has occurred. The second type of abortion may refer to an example where, while internal setting values, in particular, timing setting values, of the memory device 100 are being reset, the program operation (or the erase operation) is aborted unexpectedly. For example, the second type of abortion may occur when the reset signal RST is received from the memory controller or when the received program command PGM or the received erase command ERS is inactivated during a program operation or an erase operation.

In detail, referring to FIG. 13, while the memory device 100A is performing the program operation, namely, the memory device 100A is outputting the busy signal of the first level (HL) to the memory controller, the received program command PGM may be inactivated at a fourth time T3B. For example, the memory device 100A may receive a program command PGM transitioning from logic high HL to logic low LL at the fourth time T3B.

Referring to FIG. 14, while the memory device 100A is performing the program operation, namely, the memory device 100A is outputting the busy signal at the first level (HL) or logic state to the memory controller, the memory device 100A may receive the reset signal RST at a fourth time T3C. For example, the memory device 100A may receive a reset signal RST transitioning from logic low LL to logic high HL at the fourth time T3C.

Referring back to FIGS. 12, 13, and 14, when it is determined in S40B that the second type of abortion has occurred, the memory device 100A may output the busy signal RB at the second level or logic state (for example, logic low LL) to the memory controller, in operation 560B. For example, the memory device 100A may output a busy signal RB transitioning from logic high HL to logic low LL at a fifth time T4B or T4C, and may output the busy signal RB at the second level (LL) or logic state until a new command is received.

After the memory device 100A outputs the busy signal RB at the second level or logic state LL to the memory controller, the memory device 100A may operate in a read standby mode in preparation for performing a read operation in operation S70. When the memory controller receives the busy signal RB at the second level or logic state LL from the memory device 100A, the memory controller may transmit a command CMD for performing a next operation.

When it is determined in operation S40B that the second type of abortion has occurred, the memory device 100A may generate a second abort flag (for example, AFLAG2 of FIG. 9) in operation S45B. In operation S50B, the memory device 100A may discharge a high voltage switching circuit (for example, 131 of FIG. 9) of a voltage switching circuit (for example, 130 of FIG. 9). According to an embodiment, the memory device 100A may discharge the output line (for example, the first output line OP1 of FIG. 9) of the high voltage switching circuit 131. For example, the memory device 100A may discharge the output line OP1 of the high voltage switching circuit 131 during a time period between the fifth time T4B or T4C and a sixth time T5B or T5C.

According to an embodiment, the memory device 100A may perform operations S60B and S45B in parallel. The memory device 100A may also perform operations S60B and S50B in parallel.

When the second type of abortion where setting values are reset occurs during the program operation or the erase operation, the memory device 100A may generate the second abort flag AFLAG2 and transmit the second abort flag AFLAG2 to a second discharge circuit (for example, 160A of FIG. 9) to thereby discharge the high voltage switching circuit 131. Thus, the abortion of the program operation or the erase operation may prevent or reduce damage to a transistor within the voltage switching circuit 130.

While the inventive concept has been particularly shown and described with reference to embodiments thereof, it will be understood that various changes in form and details may be made therein without departing from the spirit and scope of the following claims.

What is claimed is:

1. A memory device comprising:
   a memory cell array;
   a voltage switching circuit configured to switch between a plurality of voltages provided to the memory cell array in response to a switching control signal;
   a discharge circuit configured to discharge an output line of the voltage switching circuit in response to a discharge signal; and
   a control circuit configured to generate the switching control signal based on a command and a high voltage enable signal received from outside of the memory device,
   wherein the voltage switching circuit comprises a high voltage switching circuit and a low voltage switching circuit, the high voltage switching circuit being configured to receive a high voltage and the low voltage switching circuit being configured to receive a low voltage, the low voltage having a lower magnitude than a magnitude of the high voltage, and
   wherein the control circuit is configured to generate the discharge signal, based on the command and activation of the high voltage enable signal, responsive to detecting an abortion of an operation corresponding to the command from among a program operation and an erase operation.

2. The memory device of claim 1, wherein the control circuit is configured to detect the abortion of the operation when the high voltage enable signal is inactivated during the operation corresponding to the command.

3. The memory device of claim 1, wherein the control circuit is configured to detect the abortion of the operation when a stop signal for stopping the operation is received from the outside of the memory device.

4. The memory device of claim 1, wherein the control circuit is configured to output a busy signal at a first level to the outside of the memory device while performing the operation corresponding to the command,
wherein the high voltage switching circuit comprises the output line of the voltage switching circuit, and
wherein the control circuit is configured to output the busy signal at a second level to the outside of the memory device after the abortion of the operation is detected and the output line of the high voltage switching circuit is discharged.

5. The memory device of claim 4, wherein the control circuit comprises an abort detector configured to generate an abort flag corresponding to the busy signal when the abortion of the operation is detected, and
wherein the control circuit is configured to generate the discharge signal, based on the abort flag.

6. The memory device of claim 1, wherein the high voltage switching circuit is configured to receive the high voltage as a first voltage via a first input line, is configured to receive a second voltage via a second input line, and is configured to output a first line voltage via a first output line, the first output line corresponding to the output line of the voltage switching circuit,
wherein the low voltage switching circuit is configured to receive the second voltage via the second input line, is configured to receive the low voltage as a third voltage via a third input line, and is configured to output a second line voltage via a second output line, and
wherein the first voltage has a greater magnitude than the second voltage, and
wherein the second voltage has a greater magnitude than the third voltage.

7. The memory device of claim 6, wherein the discharge circuit is configured to discharge the first output line of the high voltage switching circuit.

8. A memory device comprising:
a memory cell array;
a voltage switching circuit configured to switch between a plurality of voltages provided to the memory cell array in response to a switching control signal; and
a control circuit configured to generate the switching control signal based on a command and a high voltage enable signal received from outside of the memory device,
wherein the voltage switching circuit comprises a high voltage switching circuit, a low voltage switching circuit, and a discharge circuit configured to discharge a first output line of the high voltage switching circuit in response to an abort flag, the high voltage switching circuit being configured to receive a high voltage and the low voltage switching circuit being configured to receive a low voltage, the low voltage having a lower magnitude than a magnitude of the high voltage and
wherein the control circuit is configured to generate the abort flag, based on the command and activation of the high voltage enable signal, responsive to detecting an abortion of an operation corresponding to the command from among a program operation and an erase operation.

9. The memory device of claim 8, wherein the control circuit is configured to detect the abortion of the operation when the command is inactivated during the operation corresponding to the command.

10. The memory device of claim 8, wherein the control circuit is configured to detect the abortion of the operation when a reset signal for resetting setting values set to perform the operation corresponding to the command is received.

11. The memory device of claim 8, wherein the control circuit is configured to output a busy signal at a first level to outside of the memory device while performing the operation corresponding to the command, and
wherein the control circuit is configured to output a busy signal at a second level to outside of the memory device when the abortion of the operation is detected.

12. The memory device of claim 11, wherein the control circuit comprises an abort detector configured to generate the abort flag having an on-section of a certain time period from an edge where the busy signal transitions from the first level to the second level.

13. The memory device of claim 8, wherein the high voltage switching circuit is configured to receive the high voltage as a first voltage via a first input line, is configured to receive a second voltage via a second input line, and is configured to output a first line voltage via the first output line,
wherein the low voltage switching circuit is configured to receive the second voltage via the second input line, is configured to receive the low voltage as a third voltage via a third input line, and is configured to output a second line voltage via a second output line, and
wherein the first voltage has a greater magnitude than the second voltage, and
wherein the second voltage has a greater magnitude than the third voltage.

14. The memory device of claim 13, wherein the discharge circuit is electrically connected to the first output line of the high voltage switching circuit.

15. An operation method of a memory device including a memory cell array and a voltage switching circuit configured to switch between a plurality of voltages provided to the memory cell array, the operation method comprising:
receiving a command from among a program command and an erase command;
receiving a high voltage enable signal in an activated state;
outputting a busy signal at a first level to outside of the memory device while performing an operation corresponding to the command;
receiving an abortion signal from external to the memory device during the operation corresponding to the command; and
discharging an output line of a high voltage switching circuit of the voltage switching circuit responsive to the abortion signal,
wherein the voltage switching circuit comprises the high voltage switching circuit and a low voltage switching circuit, the high voltage switching circuit being configured to receive a high voltage and the low voltage switching circuit being configured to receive a low voltage, the low voltage having a lower magnitude than a magnitude of the high voltage.

16. The operation method of claim 15, wherein the discharging of the output line of the high voltage switching circuit comprises:
receiving the high voltage enable signal in an inactivated state; and discharging the high voltage switching circuit of the voltage switching circuit in response to the high voltage enable signal in the inactivated state.

17. The operation method of claim 15, wherein the discharging of the output line of the high voltage switching circuit comprises:
receiving a stop signal for stopping the operation from outside of the memory device; and
discharging the output line of the high voltage switching circuit of the voltage switching circuit in response to the stop signal.

18. The operation method of claim 15, wherein the discharging of the output line of the high voltage switching circuit comprises:
discharging the output line of the high voltage switching circuit of the voltage switching circuit responsive to inactivation of the command.

19. The operation method of claim 15, wherein the discharging of the output line of the high voltage switching circuit comprises:
receiving a reset signal for resetting setting values set to perform the operation corresponding to the command; and
discharging the output line of the high voltage switching circuit of the voltage switching circuit in response to the reset signal.

20. The operation method of claim 15, after the discharging of the output line of the high voltage switching circuit, further comprising operating in a read standby mode in preparation for performing a read operation.

* * * * *